United States Patent
Jin

(10) Patent No.: US 10,984,872 B1
(45) Date of Patent: Apr. 20, 2021

(54) NON-VOLATILE MEMORY WITH SOURCE LINE RESISTANCE COMPENSATION

(71) Applicant: Integrated Silicon Solution, (Cayman) Inc., Grand Caymans (KY)

(72) Inventor: Kyoung Chon Jin, Danville, CA (US)

(73) Assignee: INTEGRATED SILICON SOLUTION, (CAYMAN) INC., Grand Cayman (KY)

( * ) Notice: Subject to any disclaimer, the term of this patent is extended or adjusted under 35 U.S.C. 154(b) by 0 days.

(21) Appl. No.: 16/704,598

(22) Filed: Dec. 5, 2019

(51) Int. Cl.
*G11C 16/24* (2006.01)
*G11C 16/30* (2006.01)
*G11C 16/08* (2006.01)
*G11C 16/04* (2006.01)
*G11C 16/10* (2006.01)

(52) U.S. Cl.
CPC ......... *G11C 16/24* (2013.01); *G11C 16/0483* (2013.01); *G11C 16/08* (2013.01); *G11C 16/10* (2013.01); *G11C 16/30* (2013.01)

(58) Field of Classification Search
CPC ............................... G11C 16/24; G11C 16/30
USPC .......................................... 365/185.18, 185.23
See application file for complete search history.

(56) References Cited

U.S. PATENT DOCUMENTS

| | | | | |
|---|---|---|---|---|
| 7,391,645 B2* | 6/2008 | Cernea | ..................... | G11C 7/02 |
| | | | | 365/185.03 |
| 7,764,547 B2* | 7/2010 | Lee | ......................... | G11C 16/30 |
| | | | | 365/185.17 |
| 9,177,663 B2* | 11/2015 | Huynh | .................... | G11C 5/147 |
| 9,368,224 B2* | 6/2016 | Wang | ..................... | G11C 16/26 |
| 10,726,925 B2* | 7/2020 | Lang | .................... | H01L 27/1157 |

* cited by examiner

*Primary Examiner* — Son L Mai
(74) *Attorney, Agent, or Firm* — Carmen C. Cook

(57) ABSTRACT

A non-volatile memory device determines the bit-line location of a memory cell selected for memory operation relative to a nearest source line, generates a modified bit-line bias voltage based on the bit-line location and applies the modified bit-line bias voltage to the selected memory cell. In some embodiments, the memory cell is selected to be programmed. In this manner, the non-volatile memory device compensates for source line resistance at the memory cells.

20 Claims, 9 Drawing Sheets

NON-VOLATILE MEMORY WITH SOURCE LINE RESISTANCE COMPENSATION

FIELD OF THE INVENTION

The invention relates to non-volatile memory devices, and, in particular, to non-volatile memory devices implementing source line resistance compensation.

BACKGROUND OF THE INVENTION

Non-volatile memory (NVM) is a memory device that retains content stored therein even when power is removed. EEPROM and flash memory are two commonly used non-volatile memory devices. In particular, flash memory has become widely used in electronic devices, especially portable electronic devices, because of its ability to provide data storage at low power levels. Modern day flash memory devices are typically implemented using a floating gate MOS transistor device as the memory cells. A floating gate MOS transistor device includes a floating gate that is formed between a control gate and the channel region (the substrate) of the MOS device and at least partially vertically aligned with the control gate. Charge storage on the floating gate determines the stored data state ("0" or "1") of the memory cell.

In a non-volatile memory cell implemented using a floating gate MOS device, programming of the memory cell, or writing data to the memory cell, is accomplished by transferring charge carriers from the semiconductor substrate (the source or the drain) to the floating gate by tunneling through the thin gate oxide layer. Typically, a block of non-volatile memory cells is first erased by applying bias conditions to remove the charges stored on the floating gate. Then, the non-volatile memory cells can be written or programmed, usually one byte or word at a time, by applying the bias conditions opposite to the erase operation. Erase and programming operation of non-volatile memory devices require a relatively large voltage and current.

Furthermore, as non-volatile memory technology advances, source line resistance associated with the memory cells increases. In particular, the source line resistance is a function of the distance between the source contact and memory cell selected for program. Thus, memory cells at different locations in the memory array could have different source line resistance values. Moreover, a memory cell with a greater distance to the source contact will have a correspondingly higher source line resistance. Varying and increased source line resistance values could impact the program efficiency and cell program threshold voltage (Vt) distribution.

BRIEF DESCRIPTION OF THE DRAWINGS

Various embodiments of the invention are disclosed in the following detailed description and the accompanying drawings.

DETAILED DESCRIPTION

In embodiments of the present invention, a non-volatile memory device determines the bit-line location of a memory cell selected for memory operation relative to a nearest source line, generates a modified bit-line bias voltage based on the bit-line location, and applies the modified bit-line bias voltage to the selected memory cell. In some embodiments, the memory device implements the source line resistance compensation technique for memory cells during the program operation. The memory device applies a bit-line bias voltage modified based on the bit-line location of the memory cell selected for program. In this manner, the non-volatile memory device compensates for source line resistance at the memory cells to improve the program efficiency of the non-volatile memory device. In particular, the non-volatile memory device is capable of achieving more uniform program speed and realizing uniform cell program threshold voltage distribution throughout the cell array.

In embodiments of the present disclosure, the non-volatile memory device includes a two-dimensional array of non-volatile memory cells. In the present embodiment, the memory device is implemented as a flash memory device and the non-volatile memory cells are implemented as flash memory cells. In other embodiments, the memory device may be implemented as other types of non-volatile memory device. In some embodiments, the flash memory cells may be configured as a NAND flash memory array or a NOR flash memory array. In some embodiments, the memory cell array is addressed by a row decoder and a column decoder to selectively access the memory cells for read, program (write) and erase operations.

In the embodiments of the present disclosure, the flash memory cells in the memory device are implemented using a floating gate MOS transistor device. A floating gate MOS transistor device includes a source region, a drain region, a control gate and a floating gate. The source and drain regions are formed in the semiconductor substrate with the channel region disposed in between. The floating gate and the control gate are vertically disposed above the channel region and at least partially overlapped. The floating gate is electrically isolated from the substrate by a thin gate oxide layer and is electrically isolated from the control gate by another dielectric layer. The control gate of the floating gate MOS transistor device is coupled to the word line of the memory cell array while the drain region is coupled to the bit line of the memory cell array. The source regions of the floating gate MOS transistor devices are connected to a shared source line which is typically connected to the ground potential.

Figure 1:
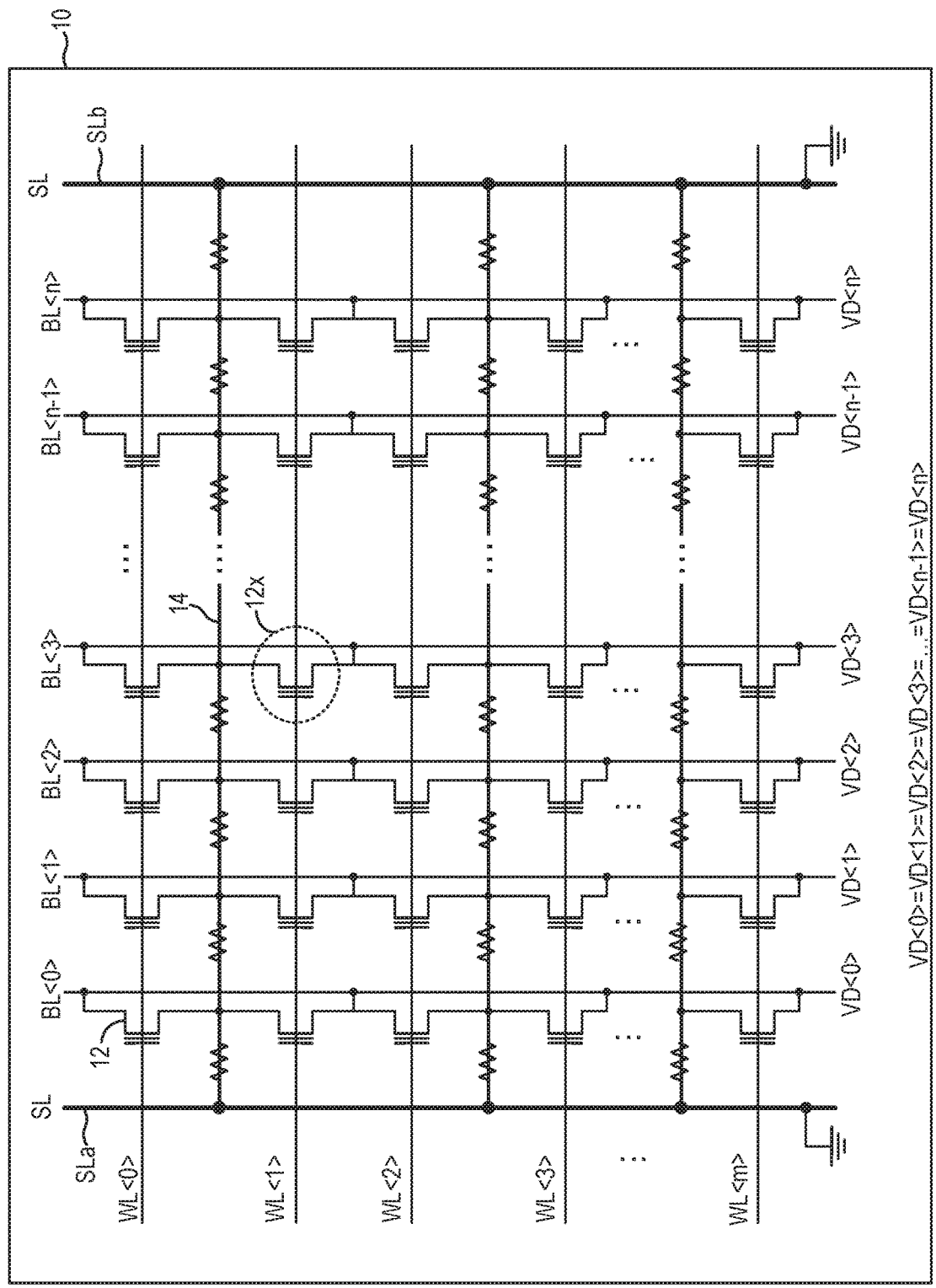
FIG. 1 is a schematic diagram of a portion of the memory cell array in a non-volatile memory device in some examples.

FIG. 1 is a schematic diagram of a portion of the memory cell array in a non-volatile memory device in some examples. Referring to FIG. 1, a memory cell array 10 includes memory cells 12 arranged in a two-dimensional array. Memory cells 12 along a row of the array are coupled to a common word line (WL) while memory cells 12 along a column of the array are coupled to a common bit line (BL). Each memory cell 12 has a control gate coupled to the respective word line (WL), a drain region coupled to the respective bit line (BL) and a source region coupled to a shared source line SL.

In particular, the memory cell array 10 includes blocks or blocks of columns of memory cells. FIG. 1 illustrates a block of memory cells of the memory cell array including n+1 columns and m+1 rows of memory cells. In the present example, each block of memory cells is bounded by a pair of source lines SL. That is, the source region of each memory cell in the block is coupled to or electrically connected to two nearest source lines (SLa and SLb) through a conductive line 14. In the present example, the m+1 rows of memory cells 12 are addressed by word lines WL<0> to WL<m> and the n+1 columns of memory cells are addressed by bit lines BL<0> to BL<n>. In one example, a block of memory cells includes 16 columns of memory cells addressed by bit lines BL<0> to BL<15>.

In one example, a memory cell 12x has a control gate connected to the word line WL<1> and a drain region connected to the bit line BL<3>. The memory cell 12x has a source region connected through the conductive line 14 to the two nearest source lines SL at both ends of the memory cell block. The connection between the source region of the memory cell 12x and the source lines SL, including the conductive line 14 or any contacts or vias in the conductive path, introduces resistance to the source line connection. In particular, the resistance from a source region of a memory cell to a source line increases for the memory cells that are farther away from the nearest source line. In the present example where the memory cells are coupled to two source lines bounding the block, the memory cells in the middle of the block have the highest source line resistance due to the longest distance from the memory cells to both of the nearest source lines.

The resistance from a memory cell source region to the nearest source lines, illustrated by the resistor symbols in FIG. 1, results in a biased source voltage at the source region of the memory cell. In particular, the source line SL are typically biased to the ground potential, or 0V, referred herein as the baseline source voltage. In the ideal case, the source regions of the memory cells 12 should be biased to the baseline source voltage (0V). However, due to the resistance from the source region of each memory cell to the source line, the source voltage at the source region of each memory cell is biased to a voltage value greater than the baseline source voltage. Furthermore, the memory cell in a row within a block have different source line resistance values due to the different cell locations relative to the two nearest source lines. Thus, the memory cells within a block have biased source voltage values that also vary within the block. The biased source voltages for the memory cells furthest away from both nearest source lines (that is, the memory cells in the middle of the block) are usually the largest due to the higher source line resistance as compared to the other memory cells in the block.

The source line resistance in the memory cell array 10 becomes particularly problematic for programming or write operations because the cell current during programming is high. For example, the cell current during read operation of the memory cells may be 20-30 µA while the cell current during programming operation may be in the range of 100-125 µA. The higher cell current during programming flowing through the source line resistance results in higher source voltage deviations at the memory cells. The source line resistance in memory cell array 10 and the variations of the source line resistance across the memory cells results in varying values of biased source voltages at the memory cells which impact the program speed of the memory device and degrades the programming efficiency of the memory device.

In embodiments of the present invention, a non-volatile memory device compensates for the source line resistance for memory cells in an array by modifying the bit-line bias voltage based on the location of the memory cell to be programmed relative to the nearest source line. In this manner, the memory device can achieve uniform program speed and improve program efficiency.

Figure 2:
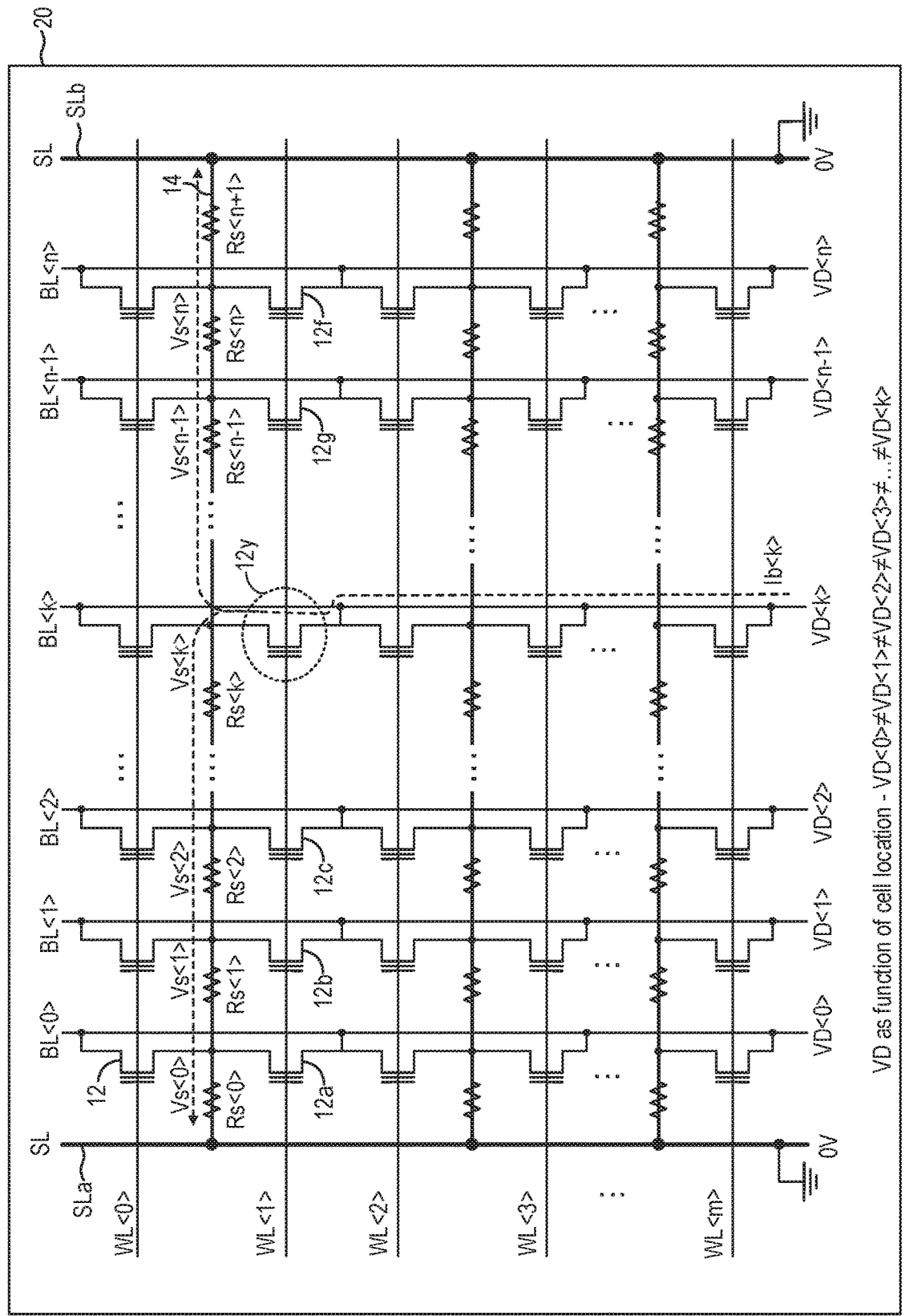
FIG. 2 is a schematic diagram of a portion of the memory cell array of the non-volatile memory device illustrating the source line resistance compensation technique in embodiments of the present disclosure.

FIG. 2 is a schematic diagram of a portion of the memory cell array of the non-volatile memory device illustrating the source line resistance compensation technique in embodiments of the present disclosure. Like elements in FIGS. 1 and 2 are given like reference numerals to simplify the discussion. In particular, the source line resistance compensation technique of the present disclosure is particularly useful during the programming or write operation of the memory device where the cell current is high and the source voltage deviations due to the source line resistance is also high as a result.

Referring to FIG. 2, a memory cell array 20 includes memory cells 12 arranged in a two-dimensional array. Memory cells 12 along a row of the array are coupled to a common word line (WL) while memory cells 12 along a column of the array are coupled to a common bit line (BL). Each memory cell 12 has a control gate coupled to the respective word line (WL), a drain region coupled to the respective bit line (BL) and a source region coupled to a shared source line SL.

The memory cell array 20 includes blocks or blocks of columns of memory cells with each block of memory cells is bounded by a pair of source lines SL (SLa and SLb). That is, the source region of each memory cell in the block is coupled to or electrically connected to two nearest source lines (SLa and SLb) through a conductive line 14. In the present example, the memory cell array 20 includes m+1 rows of memory cells 12, addressed by word lines WL<0> to WL<m> and a block of memory cells includes n+1 columns of memory cells addressed by bit lines BL<0> to BL<n>. A source line SLa is disposed adjacent the first column of memory cells in the block (associated with bit line BL<0>) and another source line SLb is disposed adjacent the last column of memory cells in the block (associated with bit line BL<n>). In this manner, a block of n+1 columns of memory cells connects to the pair of source lines (SLa and SLb) at both ends of the block through the conductive line 14.

In one example, a memory cell 12y has a control gate connected to the word line WL<1> and a drain region connected to the bit line BL<k>. The memory cell 12y has a source region connected through the conductive line 14 to the two nearest source lines SLa and SLb at both ends of the memory cell block. The connection between the source region of the memory cell 12y and the source lines SLa and SLb, including the conductive line 14 or any contacts or vias in the conductive path, introduces resistance to the source line connection. In FIG. 2, the source line resistance is illustrated by the resistor symbol on the conductive line 14.

In particular, the resistance from a source region of a memory cell to a source line SL increases for the memory cells that are farther away from the nearest source line. For instance, the resistance Rs in FIG. 2 denotes the source line resistance introduced at each memory cell along a row of memory cells. Accordingly, resistance Rs<0> denotes the resistance between the source line SLa and the memory cell 12a in the first column of the block and associated with BL<0> and resistance Rs<1> denotes the resistance between the memory cell 12a and the memory cell 12b in the second column of the block and associated with BL<1>, and so on. The source line resistance as seen by a memory cell, such as memory cell 12y, is the sum of the source line resistance from the memory cell to the nearest source line. In the present example, because each memory cell in a block is connected to two nearest source lines SLa and SLb, the total source line resistance as seen by each memory cell in the block is the parallel combination of the resistance from the memory cell to each source line. As thus configured, the memory cells in the middle of the block have the highest source line resistance due to the longest distance from the memory cells to both of the nearest source lines SLa and SLb.

More specifically, the total source line resistance as seen at the memory cell 12y at the kth column of the block is given as $$Rs_{total}(k) = \left(\sum_{i=0}^{k} Rs(i) \times \sum_{i=k+1}^{n+1} Rs(i)\right) / \left(\sum_{i=0}^{k} Rs(i) + \sum_{i=k+1}^{n+1} Rs(i)\right)$$

The memory cells in each column in a block will see a different source line resistance value due to the location of the memory cell relative to the nearest source lines. As a result of the source line resistance as seen by the memory cells, the source voltage at each memory cell is biased to a value different from the baseline source voltage (e.g. 0V). In the present illustration, the source voltage at each memory cell is denoted by Vs<k>, where k ranges from 0 to n. In particular, the source voltage Vs for a memory cell at a column k as a result of the source line resistor Rs is given as:

$$Vs(k) = Ibl(k) \times Rs_{total}(k)$$

where Ibl(k) denotes the bit-line current flowing at the memory cell at the kth location within the block.

Figures 3, 3A, 3B:
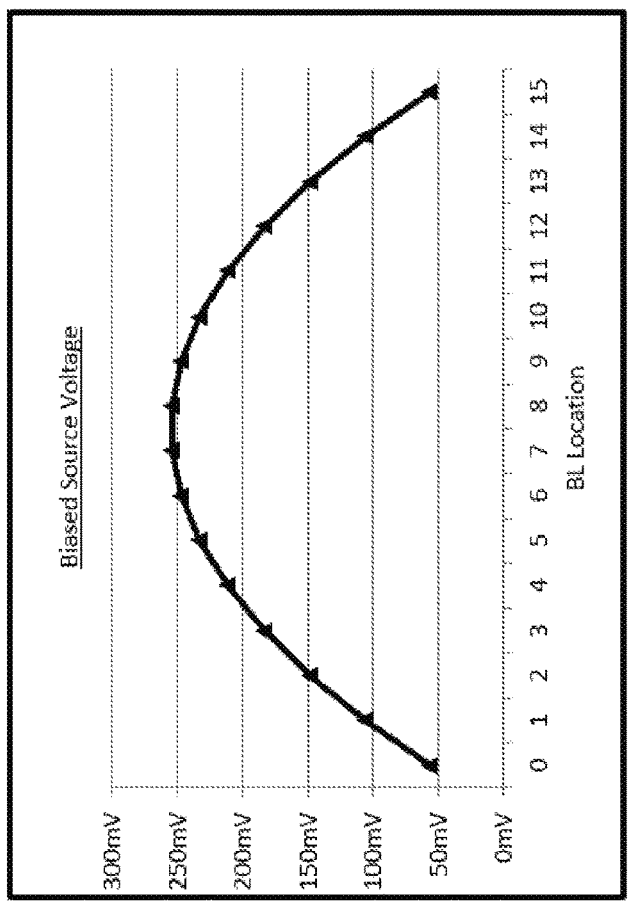
FIG. 3, which includes
FIGS. 3a and 3b, illustrates the source voltage bias behavior for memory cells in a block of the memory cell array in some examples.

The source line resistance at each memory cell introduces a source voltage bias at the source region of each memory cell as a result of cell current flowing through the memory cell. The source voltage bias refers to the drift or the deviation from the baseline source voltage provided at the source lines SL which is the intended voltage bias for the source region. The source voltage bias is high during program operation as the program cell current flowing through the memory cell is large. Furthermore, as a result of the source line resistance at each memory cell being a function of the memory cell location relative to the source lines SL, the source voltage bias at each memory cell varies across a row of memory cells in a block. FIG. 3, which includes FIGS. 3a and 3b, illustrates the source voltage bias behavior for memory cells in a block of the memory cell array in some examples. Referring to FIG. 3, a block of memory cell includes 16 columns with BL locations from 0 to 15. FIG. 3a is a table illustrating the source resistance and the program cell current that flows in the memory cells in the block. In the present example, it is assumed that the source line resistance is about 500 ohms/cell and the program cell current is 120 μA per cell. The table in FIG. 3a illustrates the source voltage bias for each memory cell in the block as a result of the source line resistance at each memory cell and the program cell current. FIG. 3b is a plot of the source voltage bias computed in the table in FIG. 3. Referring to FIGS. 3a and 3b, it can be observed that the source line resistance is lowest for the memory cells closest to the nearest source line at either end—that is, the memory cells at bit-line locations 0 and 15. The source line resistance is highest for the memory cells in the middle of the block—that is, the memory cells at bit-line locations 7 and 8. As a result, the source voltage bias has a dome shaped across the memory cells in the block. The source voltage bias is lowest for the memory cells at the ends of the block (bit-line locations 0 and 15) and the source voltage bias is highest for the memory cells at the middle of the block (bit-line locations 7 and 8). The variation of the source voltage bias, as shown in FIG. 3b, results in inefficiency during program operation as the cell program threshold voltages are not the same for the memory cells.

Returning to FIG. 2, the memory array 20 implements source line resistance compensation technique by modifying the bit-line bias voltage for program operation in accordance with the memory cell location relative to the nearest source line. The bit-line bias voltages thus applied compensate for the source voltage bias variations across memory cells in a block. In the conventional memory device, the bit-line bias voltage (VD) is the same for all the memory cell columns in a block. That is, referring to FIG. 1, the bit-line bias voltages VD<0>=VD<1>=VD<2>= . . . =VD<n>. However, in embodiments of the present disclosure, the bit-line bias voltage VD is modified by an appropriate amount to compensate for the source voltage bias resulting from the source line resistance. As shown in FIG. 2, the bit-line bias voltages VD for the columns of memory cells in a block have different voltage values. More specifically, the bit-line bias voltages VD for the columns of memory cells in a block have voltage values as a function of the memory cell location relative to the nearest source line(s).

In one embodiment, the bit-line bias voltage for program operation for a memory cell in the kth column is given as:

$$VD(k) = VD(0) + Vs(k)$$

where VD(0) denotes the baseline bit-line voltage and Vs(k) denotes the source voltage of the memory cell at that cell location, that is, at the kth column within the block of memory cells. By modifying the bit-line bias voltage by the amount of source voltage bias at that memory cell, the drain-to-source voltage across the memory cell is maintained and the source line resistance at the memory cell is thus compensated. Highly efficient program operation can be achieved.

In the present example, a block of memory cells is coupled to two source lines SL. The source line resistance is therefore a parallel combination of the resistance from the selected memory cell to each source line. The example shown in FIG. 2 is illustrative only and not intended to be limiting. In some cases, a block of memory cells may be coupled to a single source line only. In that case, the source line resistance of a given memory cell will be the resistance from that memory cell to the single source line. The memory cell closest to the source line will have the least amount of source line resistance while the memory cell farthest from the source line will have the maximum amount of source line resistance.

The source voltage drift and variation is particularly problematic during programming of the memory cells because the program cell current is high. In particular, programming or writing data to the flash memory cell is performed by transferring charge carriers from the semiconductor layer to the floating gate by tunneling through the thin gate oxide layer. An elevated gate voltage (e.g. Vg=12V) is applied to the control gate to turn on the channel and electrons can flow from the source to the drain. An elevated drain voltage (e.g. Vd=5V) is applied to the drain region relative to the source region to generate electrons with sufficiently high energy ("hot electrons") so that hot electronic injection occurs and hot electrons jump through the thin gate oxide layer onto the floating gate. When the biasing voltages are removed, the charges are trapped on the floating gate and the memory cell is programmed to a specific logical state. When the source voltage at the source region is biased to a value higher than the intended source voltage, the drain-to-source voltage of the flash memory cell is reduced, making it more difficult to program the memory cell. In particular, a flash memory cell with a smaller drain-to-source voltage is difficult or slow to program whereas a flash memory cell with a larger drain-to-source voltage is easier or faster to program. In embodiments of the present disclosure, the memory device compensates for the source line resistance and the source voltage drift by adjusting the bit-line bias voltage so that the same drain-to-source voltage across the memory cell is maintained.

Figure 4:
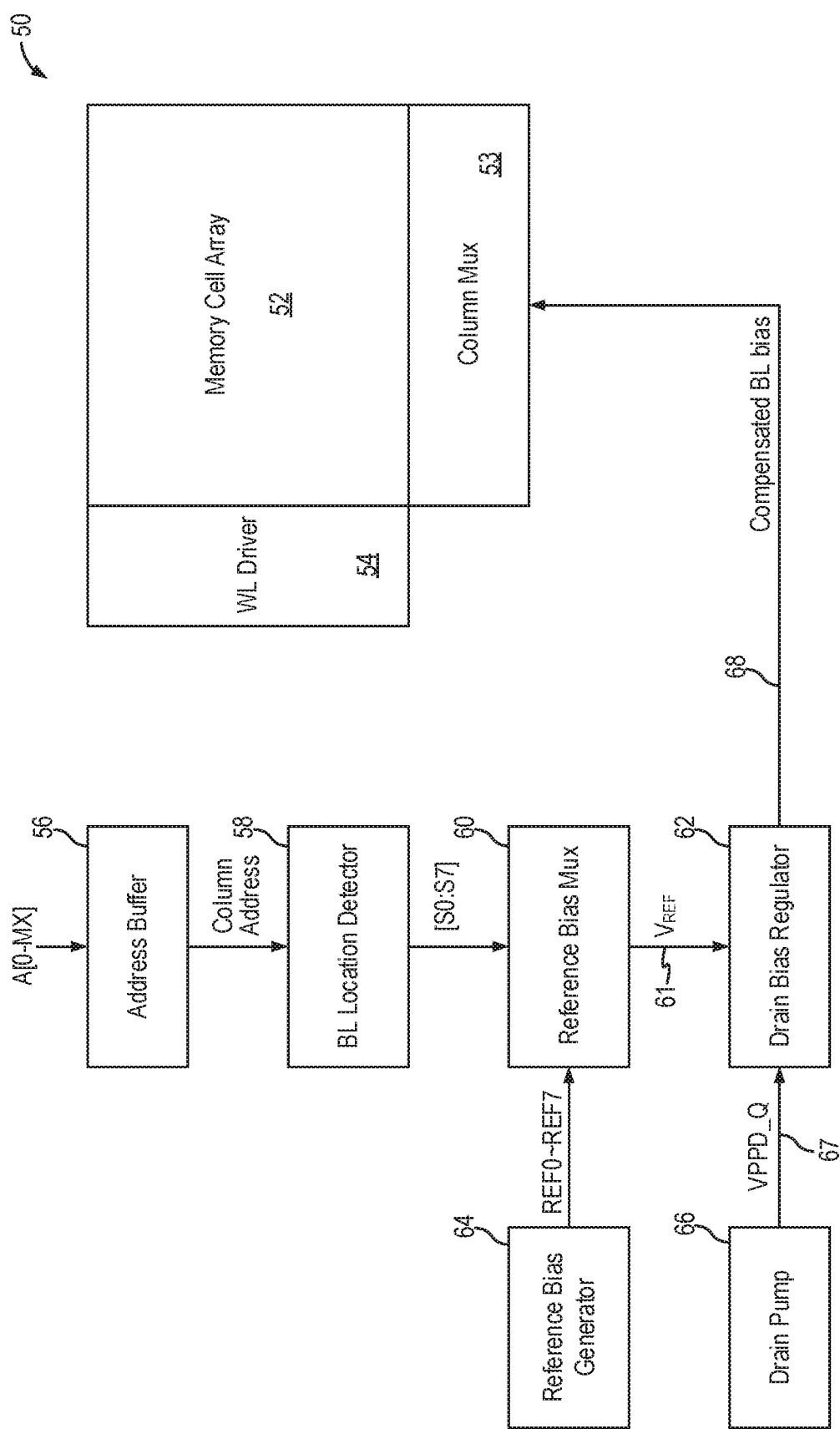
FIG. 4 is a schematic diagram of a memory device implementing the source line resistance compensation technique in embodiments of the present disclosure.

FIG. 4 is a schematic diagram of a memory device implementing the source line resistance compensation technique in embodiments of the present disclosure. Referring to FIG. 4, a non-volatile memory device 50 includes a two-dimensional memory cell array 52 of non-volatile memory cells. The memory cells in the memory cell array are arranged with the bit lines defining the columns of the memory cells and word lines defining the rows of the memory cells. Each row of memory cells is connected to a common word line (WL0 to WLM). Each column of memory cells is connected to a common bit line (BL0 to BLN). A memory cell is selected for access when the word line and the bit line associated with that memory cell are activated.

To access a memory cell in a memory cell array for memory operations (read, program or erase), the memory cell is selected or accessed by an input memory address A[0-MX] to the memory device. The input memory address may be latched and divided into a row address which is coupled to a row decoder (not shown) and a column address which is coupled to the column decoder (not shown). The row decoder decodes the row address which is coupled to the word line driver 54 to activate one word line out of word lines WL0 to WLM. The column decoder decodes the column address which is coupled to the column multiplexer 53 to activate one bit line out of bit lines BL0 to BLN. In this manner, the memory cell associated with the activated word line and the activated bit line is made available for either read, write or erase operation. In practice, the memory device activates the memory cells associated with all of the I/Os of the memory device. For example, the memory cells associated with one byte of data or eight I/Os, may be activated for access based on the input memory address.

The memory device 50 implements source line resistance compensation technique of the present disclosure by generating compensated or modified bit-line bias voltages to drive the activated bit lines of the memory cell array 52. The memory device 50 includes an address buffer 56 for receiving the input memory address A[0-MX] selecting a memory cell for access. For example, the input memory address A[0-MX] may select a memory cell to program the memory cell. The address buffer 56 stores or latch the input memory address. The address buffer 56 is illustrative only and not intended to be limiting. In actual implementation, the address buffer 56 may be a buffer, a latch or other appropriate circuit for receiving and storing the input memory address. The exact implementation of the address buffer 56 is not critical to the practice of the present invention.

The memory device 50 includes a bit-line location detector 58 which receives the column address of the input memory address and determines the cell location or the bit-line location of the selected memory cell relative to the nearest source line(s). In one embodiment, the bit-line location detector 58 determines the cell location or the bit-line location of the selected memory cell within a block of memory cells. In some embodiments, the block of memory cells may be coupled to a single source line running parallel to the bit lines. In the present embodiment, the block of memory cells is coupled to two source lines located at either ends of the block. The bit-line location detector 58 provides a select signal as output. In the present embodiment, the block of memory cells is assumed to include 16 memory cells and the select signal is an 8-bit selection signal [S0:S7]. The select signal activates one bit out of the signal [S0:S7] to indicate the cell location of the selected memory cell within the block.

In particular, in a block of memory cells coupled to two source lines at both ends, the source line resistance has a distribution that is symmetrical about the memory cells in the middle of the block, as shown in FIG. 3b. Therefore, the bit-line location detector 58 only needs to identify the cell location of the selected memory cell within half of the block.

By determining the cell location or the bit-line location of the selected memory cell, the total source line resistance of the selected memory cell can be estimated and the source voltage bias can be calculated based on the expected cell current. For example, when the memory cell is selected to be programmed, the source voltage bias can be calculated based on the program cell current.

The memory device 50 includes a reference bias generator 64 for generating a set of reference voltages REF0 to REF7. The set of reference voltages REF0 to REF7 have voltage values selected for compensating the source line resistance corresponding to the bit-line location of a memory cell within the block. In particular, the set of reference voltages REF0 to REF7 have voltage values selected to compensate the source voltage bias at each corresponding bit-line location as a result of the cell current flowing through the source line resistance. In one embodiment, the set of reference voltages REF0 to REF7 can have voltage values selected to compensate the source voltage bias at each corresponding bit-line location for the program operation of the memory cells.

In particular, reference voltage REF0 corresponds to bit line B0, reference voltage REF1 corresponds to bit line B1, and reference voltage REF7 corresponds to bit line B7. For a block of memory cells with 16 bit lines, the other half of the block can be treated as the first half by flipping the bit lines. That is, REF0 corresponds to bit line B15, reference voltage REF1 corresponds to bit line B14, and reference voltage REF7 corresponds to bit line B8.

The set of reference voltages REF0 to REF7 are provided to a reference bias multiplexer 60. The reference bias multiplexer selects one reference voltage $V_{REF}$ out of the set of reference voltages REF0 to REF7 in response to the select signal [S0:S7]. In this manner, a reference voltage $V_{REF}$ (node 61) corresponding to the cell location or bit-line location of the selected memory cell is selected by the reference bias multiplexer 60.

With the reference voltage V$_{REF}$ selected, the memory device 50 applies the reference voltage to adjust the bit-line bias voltage. The memory device 50 includes a drain pump 66 for generating a baseline bit-line bias voltage VPPD (node 67). The memory device 50 further includes a drain bias regulator 62 which receives the baseline bit-line bias voltage VPPD from the drain pump and also receives the reference voltage V$_{REF}$ from the reference bias multiplexer 60. The drain bias regulator 62 generates a compensated bit-line bias voltage (node 68) using the reference voltage V$_{REF}$ and the baseline bias voltage VPPD. The compensated bit-line bias voltage, also referred to as the modified bit-line bias voltage, is coupled to the column multiplexer 53 to drive the selected bit line to activate the selected bit line for the memory operation. For example, the modified bit-line bias voltage is applied to column multiplexer 53 to activate the selected bit line for programming the selected memory cell.

As thus configured, the memory device 50 provides a compensated bit-line bias voltage that is based on the cell location of the selected memory cell relative to the nearest source line(s). In this manner, the bit-line bias voltage is modified to compensate for the source voltage drift at the selected memory cell. Using the source line resistance compensation technique described herein, the memory device can improve program efficiency and the memory cell threshold voltage distribution. Furthermore, because the source line resistance compensation technique described herein allows the source line resistance and the resulting source voltage drift to be compensated, it is possible for the memory device to be configured with fewer source lines or larger interval between source lines, thereby saving valuable area in the cell array. In other words, the memory device can be constructed using larger number of memory cells columns in a block. In the conventional memory device, it is not desirable to have fewer source lines or a block with large number of memory cell columns because this would result in higher source line resistance for the memory cells farthest away from the nearest source lines. However, because the source line resistance compensation technical of the present disclosure can be applied to compensate for the source line resistance at any location within the block, it is possible to construct the memory cell array with fewer number of source lines and larger number of memory cell columns within a block, without sacrificing programming efficiency.

Figure 5:
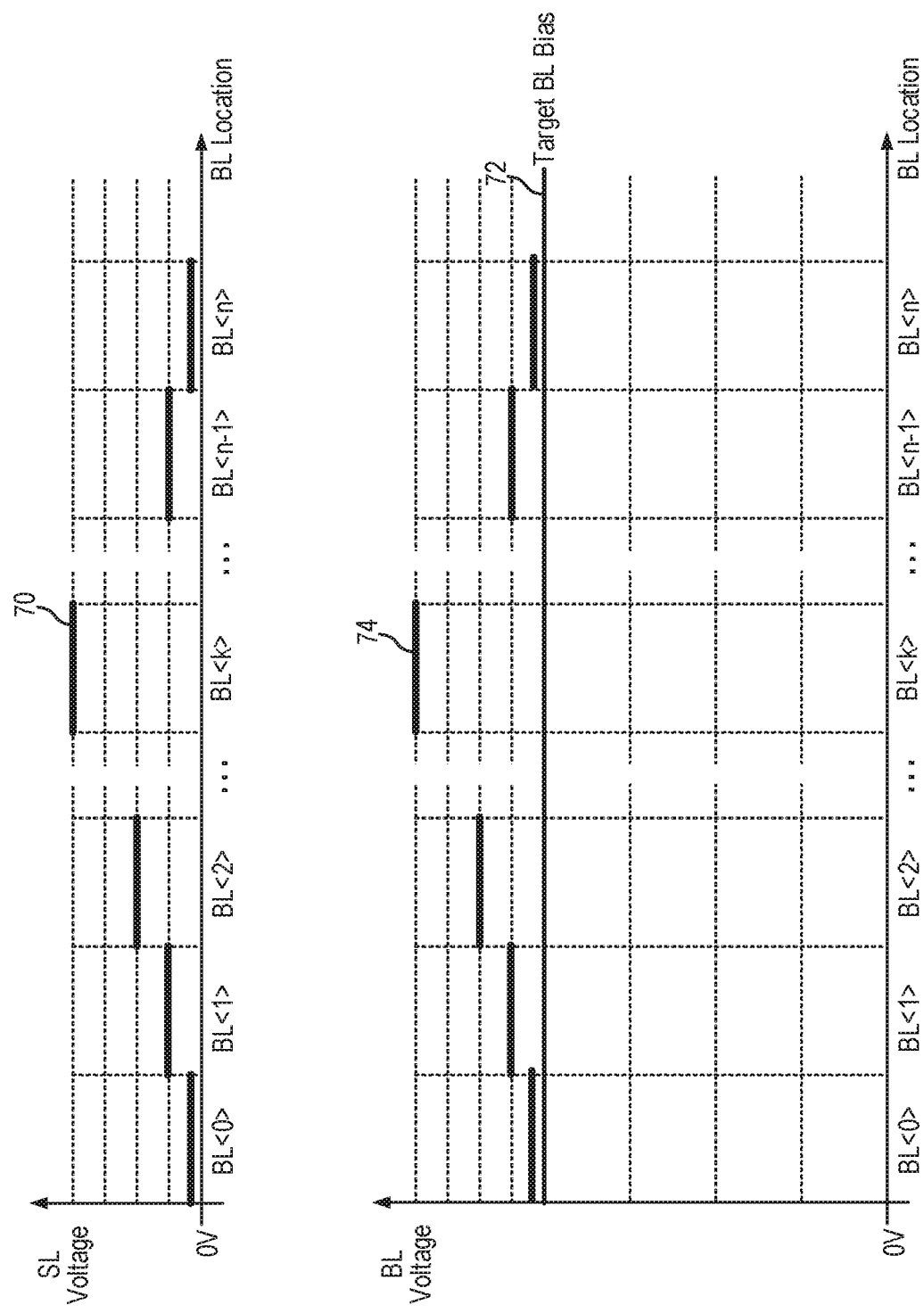
FIG. 5 is plot illustrating the modified bit-line bias voltage generated for different bit-line locations in some examples.

FIG. 5 is plot illustrating the modified bit-line bias voltage generated for different bit-line locations in some examples. Referring to FIG. 5, curve 70 depicts the source voltages (SL voltage) over bit-line locations in a block of memory cells. In the present example, the block of memory cells includes bit-line locations from BL(0) to BL(n) and it is assumed that the block of memory cells is coupled to two source lines at either end of the block. That is, one source line adjacent bit line BL(0) and one source line adjacent bit line BL(n). As shown in FIG. 5, the source voltage drifts from the ground voltage (0V) as a result of the source line resistance at each memory cell and the source voltage increases for memory cell locations farther away from the source lines at both lines. For example, a memory cell associated with bit line BL(k) in the middle of the block has the highest source voltage drift.

According to embodiments of the present disclosure, the bit-line bias voltage is modified to compensate for the drift in source voltage at each memory cell location. In FIG. 5, curve 74 depicts the bit-line bias voltage (BL voltage) over bit-line locations in the block of memory cells. In conventional memory devices, the bit-line bias voltage will be set to the target bit-line bias voltage (curve 72) (also referred to as the baseline bit-line bias voltage). However, the memory device of the present disclosure modifies the bit-line bias voltage based on the bit-line location so that the bit-line bias voltage compensates for the drift in the source voltage. As shown in FIG. 5, the modified bit-line bias voltage (curve 74) tracks the increase in source voltage as the memory cell locations move from the edge (BL(0)) to the middle of the block (BL(k)). By modifying the bit-line bias voltage according to the cell location, the memory device maintains the drain-to-source voltage bias across memory cells in a block and memory operations, such as programming of the memory cells, are not affected by the source line resistance.

Figure 6:
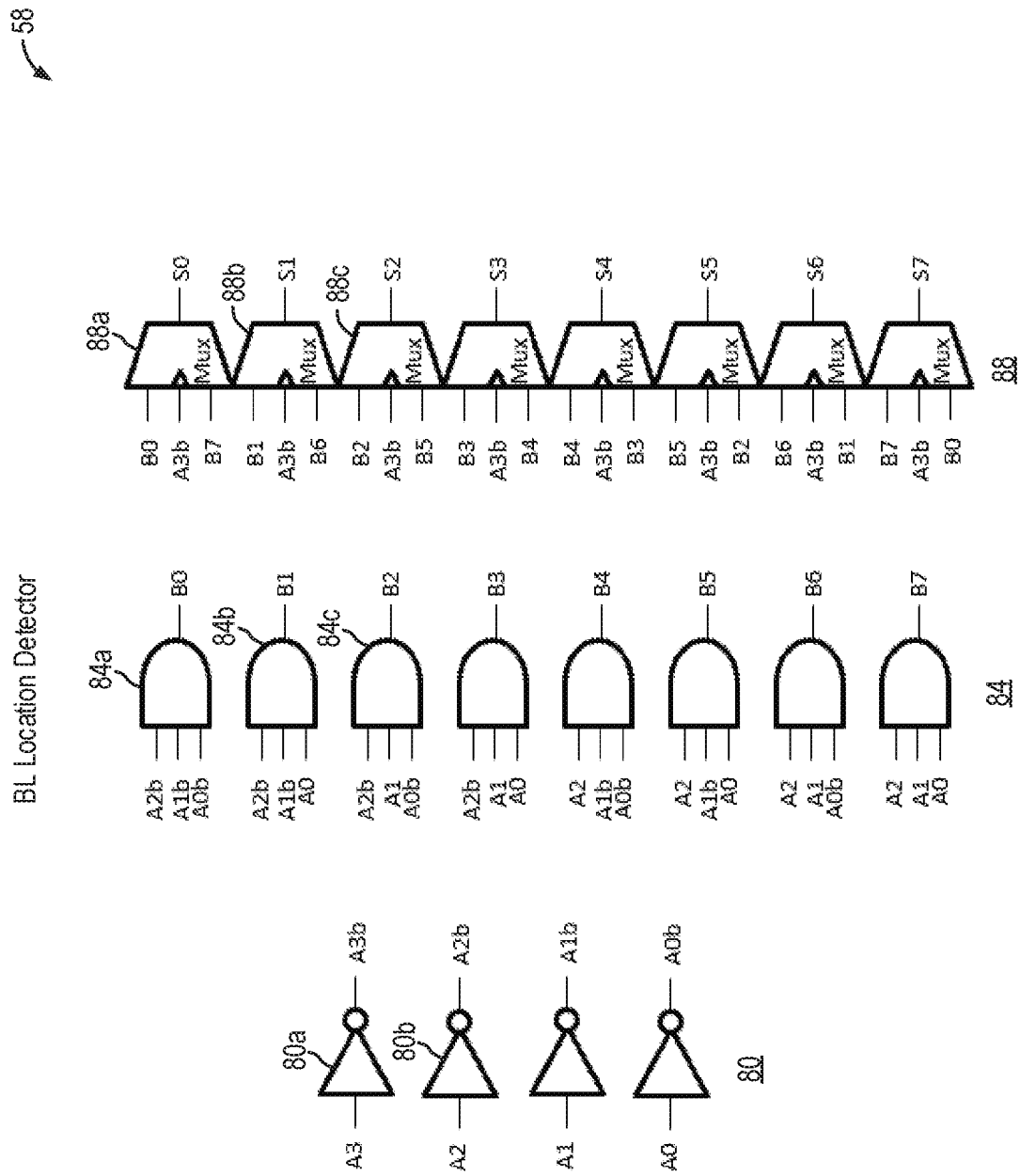
FIG. 6 is a schematic diagram of a bit-line location detector in some embodiments.

FIG. 6 is a schematic diagram of a bit-line location detector in some embodiments. Referring to FIG. 6, the bit-line location detector 58 includes a bank of inverters 80 receiving the column address (e.g. A0 to A3) of the input memory address and generating the logical inverse of the column addresses (e.g. A0b to A3b). The bit-line location detector 58 includes a set of AND gates 84 to detect the bit-line location indicated by the lower address bits of the column address (e.g. A0, A1, A2). The set of AND gates 84 generate a set of bit indicators B0 to B7 to indicate the location of the bit line within half the column addresses, or half of the block of memory cells. Because the block is symmetrical, the bit-line location detector 58 can detect bit-line locations for the first half of the block and then flip over the other half of the block using the most significant bit (MSB) of the column address.

In the present example, a block of memory cells include 16 bit lines. The column address includes four bits A0 to A3. The set of AND gates 84 generate eight bit indicators B0 to B7 using the lower three bits of the column address A0 to A2. The bit-line location detector 58 includes a set of multiplexers 88 receiving the MSB of the column address (A3 or A3b) as the select signal. The set of multiplexers 88 determine whether the column address is in the first half or the second half of the block using the MSB of the column address A3/A3b. The set of multiplexers 88 provides a set of select signals S0 to S7 as output signals. The set of select signals can be referred to as a multiple-bit signal [S0:S7] where one bit of the select signal is activated to indicate the bit-line location of the selected memory cell.

In the present example, for the first half of the block, the MSB of the column address is logical low or logical "0". The set of multiplexers, under the select signal A3b (logical "1"), selects the top input to provide as output. Therefore, the set of multiplexers 88 select bit indicators B0 to B7 as the select signals S0 to S7. For the second half of the block, the MSB of the column address is logical high or logical "1". The set of multiplexers, under the select signal A3b (logical "0"), selects the bottom input to provide as output. Therefore, the set of multiplexers 88 select bit indicators B7 to B0 as the select signals S0 to S7.

Figure 7:
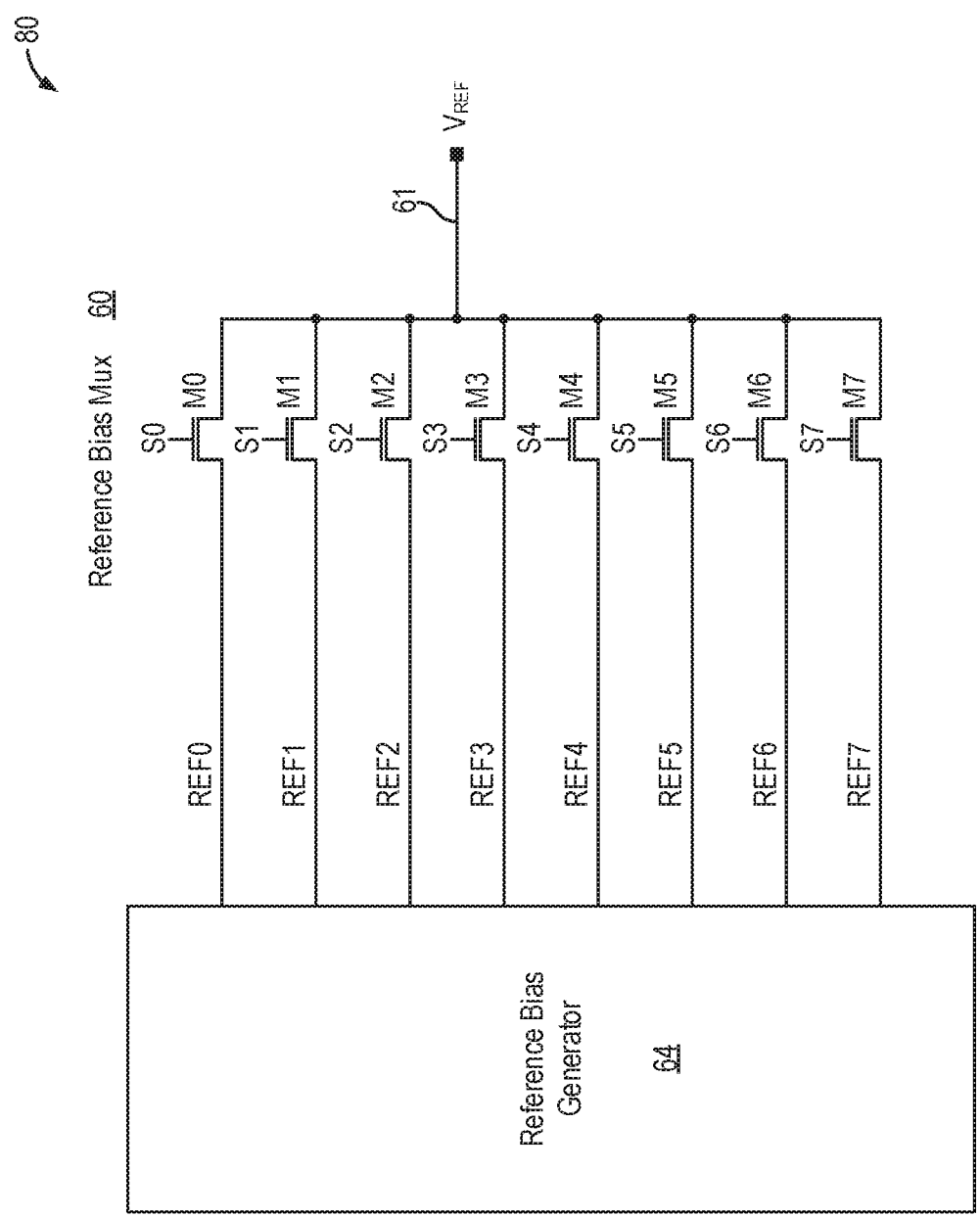
FIG. 7 is a schematic diagram of a reference voltage generator in some embodiments.

FIG. 7 is a schematic diagram of a reference voltage generator in some embodiments. Referring to FIG. 7, a reference voltage generator 80 includes the reference bias generator 64 and the reference bias multiplexer 60. The reference bias generator 64 generates a set of reference voltages REF0 to REF7. In some embodiments, the reference bias generator 64 can be bandgap reference circuits or other constant voltage generation circuit. The reference bias multiplexer 60 includes switches M0 to M7, each switch being controlled by the respective select signal S0 to S7. In operation, one of the select signals S0 to S7 is activated to provide one of the reference voltages REF0 to REF7 as the reference voltage V$_{REF}$ (node 61).

Figure 8:
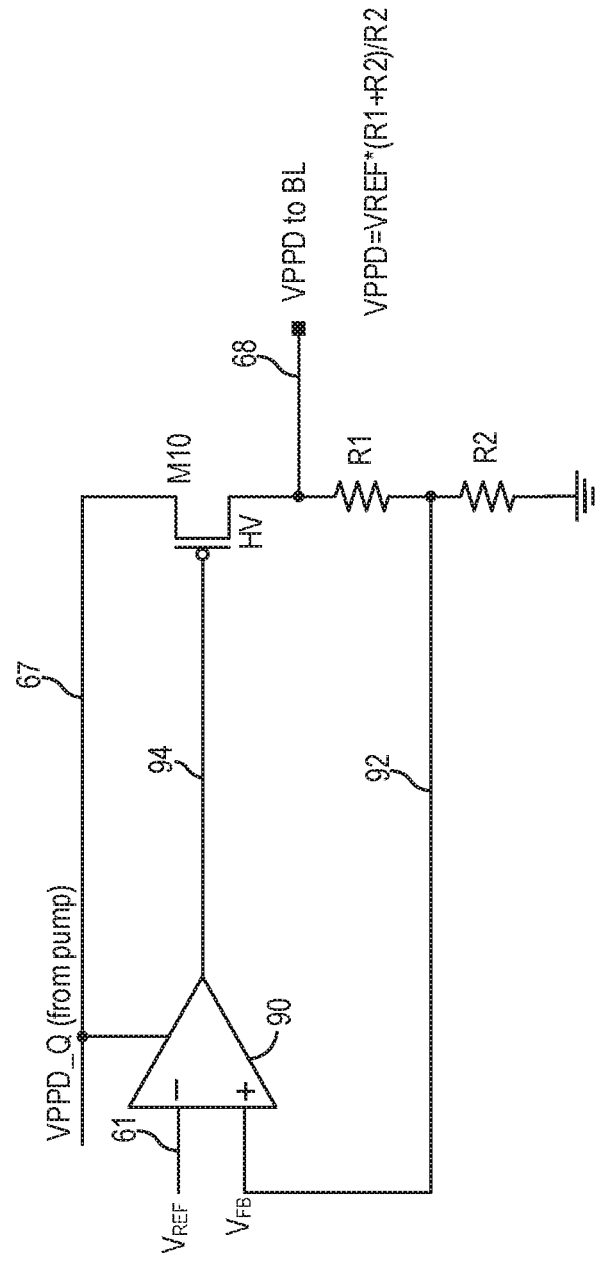
FIG. 8 is a schematic diagram of a drain bias regulator in some embodiments.

FIG. 8 is a schematic diagram of a drain bias regulator in some embodiments. Referring to FIG. 8, the drain bias regulator 62 includes an error amplifier 90 receiving the reference voltage $V_{REF}$ (node 61) and a feedback voltage $V_{FB}$ (node 92). The error amplifier 90 is supplied by the baseline bit-line bias voltage VPPD Q (node 67) generated by the drain pump 66 (FIG. 4). The error amplifier 90 operates to control PMOS transistor M10 to set the voltage at the feedback node 92 to the reference voltage $V_{REF}$. In particular, a voltage divider formed by resistors R1 and R2 is coupled to the drain of transistor M10. The drain terminal (node 68) of transistor M10 provides the compensated bit-line bias voltage VPPD. As thus configured, the compensated bit-line bias voltage VPPD (node 68) is given as:

$$VPPD = V_{REF} \times (R1+R2)/R2$$

where R1 and R2 denotes the resistance of the resistors in the voltage divider. In this manner, the compensated bit-line bias voltage is generated based on the reference voltage $V_{REF}$ which is selected based on the bit-line location of the selected memory cell.

Figure 9:
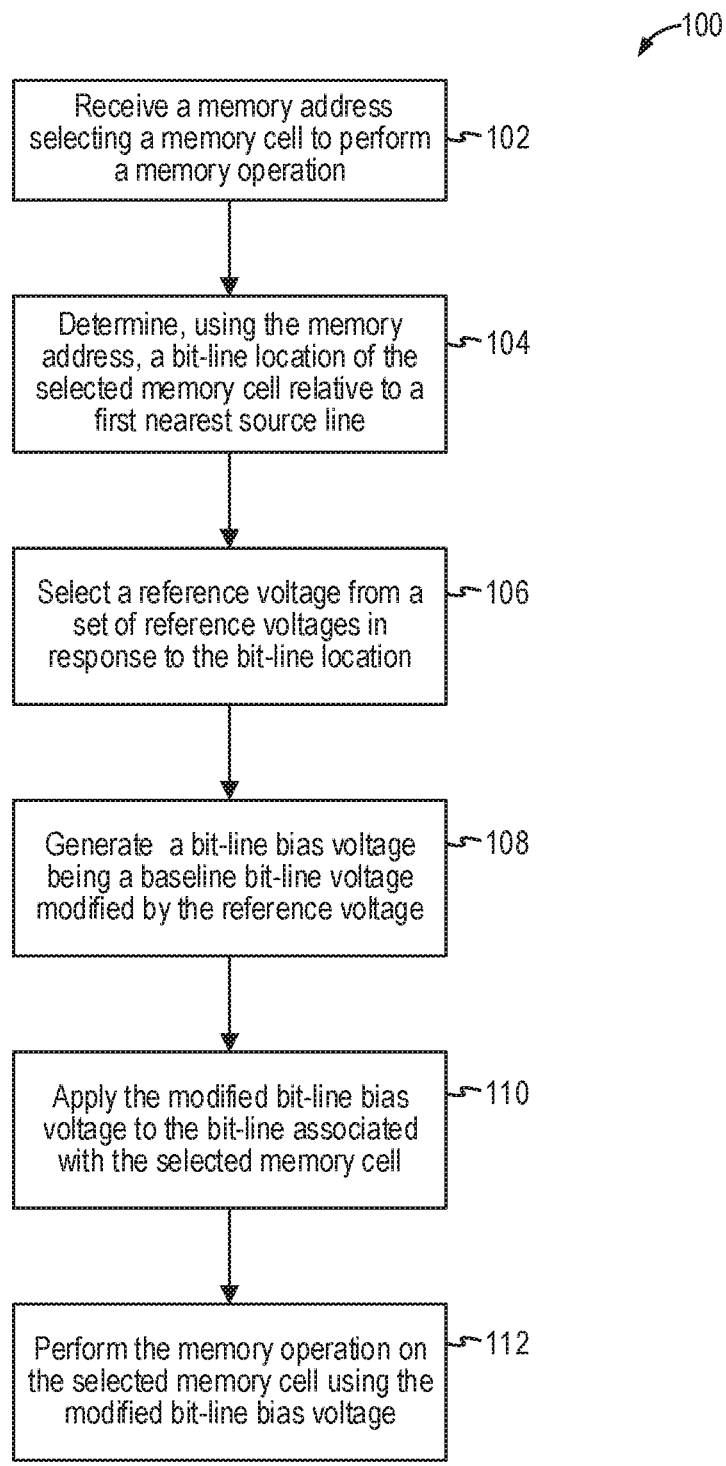
FIG. 9 is a flowchart illustrating the source line resistance compensation technique in embodiments of the present disclosure.

FIG. 9 is a flowchart illustrating the source line resistance compensation technique in embodiments of the present disclosure. Referring to FIG. 9, a method 100 for compensating source line resistance is implemented in a non-volatile memory device including a two-dimensional array of memory cells, each memory cell being accessed by a word line and a bit line and having a source region coupled to a source line providing a baseline source voltage. The method 100 starts with receiving a memory address selecting a memory cell in the array of memory cells to perform a memory operation (102). The memory address indicates a word line and a bit line associated with the selected memory cell. In some embodiments, the memory operation includes reading, writing or programming or erasing the selected memory cell.

The method 100 determines, using the memory address, a bit-line location of the selected memory cell relative to a first nearest source line in the array of memory cells (104). The method 100 then selects a reference voltage from a set of reference voltages in response to the bit-line location of the selected memory cell relative to the first nearest source line (106). The method 100 then generates a bit-line bias voltage being a baseline bit-line voltage modified by the reference voltage (108). The method then applies the modified bit-line bias voltage to the bit-line associated with the selected memory cell (110). The method 100 then performs the memory operation on the selected memory cell using the modified bit-line bias voltage (112).

In some embodiments, the memory cell is selected to be programmed and the method 100 programs the selected memory cell using the modified bit-line bias voltage.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided above along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The above detailed descriptions are provided to illustrate specific embodiments of the present invention and are not intended to be limiting. Numerous modifications and variations within the scope of the present invention are possible. The present invention is defined by the appended claims.

What is claimed is:

1. A method in a non-volatile memory device including a two-dimensional array of memory cells, each memory cell being accessed by a word line and a bit line and having a source region coupled to a source line providing a baseline source voltage, the method comprising:
  receiving a memory address selecting a memory cell in the array of memory cells to perform a memory operation, the memory address indicating a word line and a bit line associated with the selected memory cell;
  determining, using the memory address, a bit-line location of the selected memory cell relative to a first nearest source line in the array of memory cells;
  selecting a reference voltage from a set of reference voltages in response to the bit-line location of the selected memory cell relative to the first nearest source line;
  generating a modified bit-line bias voltage being a baseline bit-line voltage modified by the reference voltage;
  applying the modified bit-line bias voltage to the bit-line associated with the selected memory cell; and
  performing the memory operation on the selected memory cell using the modified bit-line bias voltage.

2. The method of claim 1, wherein:
  receiving the memory address selecting the memory cell in the array of memory cells to perform a memory operation comprises receiving the memory address selecting the memory cell in the array of memory cells to program; and
  performing the memory operation on the selected memory cell using the modified bit-line bias voltage comprises programming the selected memory cell using the modified bit-line bias voltage.

3. The method of claim 1, further comprising:
  decoding a row address of the memory address to activate the word line associated with the selected memory cell;
  decoding a column address of the memory address to activate the bit line associated with the selected memory cell; and
  applying the modified bit-line bias voltage to the activated bit-line to perform the memory operation on the selected memory cell.

4. The method of claim 1, wherein each memory cell in the array of memory cells has a source line resistance at the source region indicative of a resistance from the source region at the memory cell to the first nearest source line; and wherein the source region of the selected memory cell has a source voltage being greater than the baseline source voltage by a first voltage indicative of the source line resistance at the selected memory cell and the cell current flowing through the selected memory cell, the reference voltage being related to the first voltage at the selected memory cell.

5. The method of claim 4, wherein generating the bit-line bias voltage being the baseline bit-line voltage modified by the reference voltage comprises:
   generating the bit-line bias voltage being the reference voltage added to the baseline bit-line voltage.

6. The method of claim 1, wherein the array of memory cells comprises blocks of memory cell, each block of memory cells being formed by columns of memory cells and being coupled to the first nearest source line disposed at a first column of memory cells in the block and a second nearest source line disposed at a last column of the memory cells in the block, a memory cell in each block being coupled to the first and second nearest source lines, each memory cell having a source line resistance at the source region being a first resistance from the source region of the memory cell to the first nearest source line in parallel with a second resistance from the source region of the memory cell to the second nearest source line; and wherein the source region of the selected memory cell has a source voltage being greater than the baseline source voltage by a second voltage indicative of the source line resistance at the selected memory cell, the reference voltage being related to the source voltage at the selected memory cell.

7. The method of claim 1, wherein selecting a reference voltage from a set of reference voltages in response to the bit-line location of the selected memory cell relative to the first nearest source line comprises:
   providing the set of reference voltages having increasing voltage values corresponding to bit-line locations having increasing distance relative to the first nearest source line; and
   selecting the reference voltage from the set of reference voltages based on the bit-line location of the selected memory cell relative to the first nearest source line.

8. The method of claim 7, wherein providing the set of reference voltages having increasing voltage values corresponding to bit-line locations of memory cells having increasing distance relative to the first nearest source line comprises:
   providing each reference voltage in the set of reference voltages having a voltage value corresponding to the source line resistance of a respective memory cell at the respective bit-line location relative to the first nearest source line and an estimated cell current flowing through the respective memory cell for the respective memory operation.

9. The method of claim 7, wherein the memory operation comprises a program operation and providing the set of reference voltages having increasing voltage values corresponding to bit-line locations of memory cells having increasing distance relative to the first nearest source line comprises:
   providing each reference voltage in the set of reference voltages having a voltage value corresponding to the source line resistance of a respective memory cell at the respective bit-line location relative to the first nearest source line and a program cell current flowing through the respective memory cell.

10. The method of claim 1, wherein the two-dimensional array of non-volatile memory cells comprises flash memory cells.

11. A non-volatile memory device, comprising:
   a two-dimensional array of non-volatile memory cells, each memory cell being accessed by a word line and a bit line and having a source region coupled to a source line providing a baseline source voltage;
   a word-line driver selecting one of a plurality of word-lines in the array in response to an input memory address;
   a bit-line selection circuit configured to select one of a plurality of bit-lines in the array in response to the input memory address;
   a bit-line location detector receiving the input memory address selecting a memory cell in the array of memory cells to perform a memory operation, the input memory address indicating a word line and a bit line associated with the selected memory cell, the bit-line location detector determining, using the memory address, a bit-line location of the selected memory cell relative to a first nearest source line in the array of memory cells and generating a selection signal;
   a reference bias selector receiving the selection signal and selecting a reference voltage from a set of reference voltages in response to the selection signal; and
   a bit-line bias generator receiving the reference voltage and generating a modified bit-line bias voltage being a baseline bit-line voltage modified by the reference voltage,
   wherein the modified bit-line bias voltage is applied to the bit-line associated with the selected memory cell to perform the memory operation on the selected memory cell.

12. The non-volatile memory device of claim 11, further comprising:
   an address buffer receiving the input memory address and providing a column address of the input memory address to the bit-line location detector to determine the bit-line location.

13. The non-volatile memory device of claim 11, wherein the memory operation comprises a program operation and the modified bit-line bias voltage is applied to the bit-line associated with the selected memory cell to program the selected memory cell.

14. The non-volatile memory device of claim 11, wherein each memory cell in the array of memory cells has a source line resistance at the source region indicative of a resistance from the source region at the memory cell to the first nearest source line; and wherein the source region of the selected memory cell has a source voltage being greater than the baseline source voltage by a first voltage indicative of the source line resistance at the selected memory cell and the cell current flowing through the selected memory cell, the reference voltage being related to the first voltage at the selected memory cell.

15. The non-volatile memory device of claim 11, wherein the bit-line bias generator generates the modified bit-line bias voltage by adding the reference voltage to the baseline bit-line voltage.

16. The non-volatile memory device of claim 11, wherein the array of memory cells comprises blocks of memory cell, each block of memory cells being formed by columns of memory cells and being coupled to the first nearest source line disposed at a first column of memory cells in the block and a second nearest source line disposed at a last column of the memory cells in the block, a memory cell in each block being coupled to the first and second nearest source lines, each memory cell having a source line resistance at the source region being a first resistance from the source region of the memory cell to the first nearest source line in parallel with a second resistance from the source region of the memory cell to the second nearest source line; and wherein the source region of the selected memory cell has a source voltage being greater than the baseline source voltage by a second voltage indicative of the source line resistance at the selected memory cell, the reference voltage being related to the source voltage at the selected memory cell.

17. The non-volatile memory device of claim 11, wherein the set of reference voltages has increasing voltage values corresponding to bit-line locations having increasing distance relative to the first nearest source line and the reference voltage is selected from the set of reference voltages in response to the selection signal indicative of the bit-line location of the selected memory cell relative to the first nearest source line.

18. The non-volatile memory device of claim 17, wherein each reference voltage in the set of reference voltages has a voltage value corresponding to the source line resistance of a respective memory cell at the respective bit-line location relative to the first nearest source line and an estimated cell current flowing through the respective memory cell for the respective memory operation.

19. The non-volatile memory device of claim 17, wherein each reference voltage in the set of reference voltages has a voltage value corresponding to the source line resistance of a respective memory cell at the respective bit-line location relative to the first nearest source line and a program cell current flowing through the respective memory cell.

20. The non-volatile memory device of claim 11, wherein the two-dimensional array of non-volatile memory cells comprises flash memory cells.

\* \* \* \* \*